United States Patent
Hu

(10) Patent No.: US 10,923,511 B2
(45) Date of Patent: Feb. 16, 2021

(54) ARRAY SUBSTRATE AND DISPLAY DEVICE COMPRISING SAME

(71) Applicant: Wuhan China Star Optoelectronics Semiconductor Display Technology Co., Ltd., Wuhan (CN)

(72) Inventor: Junyan Hu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 18 days.

(21) Appl. No.: 16/467,064

(22) PCT Filed: Jan. 23, 2019

(86) PCT No.: PCT/CN2019/072855
§ 371 (c)(1),
(2) Date: Jun. 6, 2019

(87) PCT Pub. No.: WO2020/118875
PCT Pub. Date: Jun. 18, 2020

(65) Prior Publication Data
US 2020/0194469 A1 Jun. 18, 2020

(30) Foreign Application Priority Data
Dec. 14, 2018 (CN) .......................... 201811531133.6

(51) Int. Cl.
| H01L 27/14 | (2006.01) |
| H01L 27/12 | (2006.01) |
| G02F 1/1362 | (2006.01) |
| G02F 1/1368 | (2006.01) |
| G02F 1/1333 | (2006.01) |

(52) U.S. Cl.
CPC ........ *H01L 27/1244* (2013.01); *G02F 1/1368* (2013.01); *G02F 1/133305* (2013.01); *G02F 1/136227* (2013.01); *G02F 1/136286* (2013.01); *H01L 27/1218* (2013.01); *H01L 27/1248* (2013.01); *H01L 27/1262* (2013.01); *G02F 2001/13685* (2013.01); *G02F 2001/136295* (2013.01)

(58) Field of Classification Search
CPC . H01L 27/32; H01L 27/3258; H01L 27/3262; H01L 27/1244; H01L 27/1218; H01L 27/1248
See application file for complete search history.

(56) References Cited

U.S. PATENT DOCUMENTS

| 7,369,090 B1* | 5/2008 | Beard | H01Q 1/242 |
| | | | 257/734 |
| 2017/0092708 A1* | 3/2017 | Jeon | H01L 27/127 |
| 2019/0123114 A1* | 4/2019 | Park | H01L 27/3276 |
| 2019/0267570 A1* | 8/2019 | Huang | H01L 51/5246 |

* cited by examiner

*Primary Examiner* — Phuc T Dang

(57) ABSTRACT

An array substrate and a display device having thereof, the array substrate having a display region and a bending region surrounding the display region, wherein the array substrate includes a first substrate layer, a first buffer layer, a second substrate layer, at least one opening, and at least one metal trace extending over the display region and the bending region, wherein at least a part of the at least one metal trace covers a surface inside the at least one opening; an organic layer disposed in the at least one opening and encasing the at least one metal trace located inside the at least one opening.

9 Claims, 3 Drawing Sheets

ARRAY SUBSTRATE AND DISPLAY DEVICE COMPRISING SAME

RELATED APPLICATIONS

This application is a National Phase of PCT Patent Application No. PCT/CN2019/072855 having International filing date of Jan. 23, 2019, which claims the benefit of priority of Chinese Patent Application No. 201811531133.6 filed on Dec. 14, 2018. The contents of the above applications are all incorporated by reference as if fully set forth herein in their entirety.

FIELD AND BACKGROUND OF THE INVENTION

The present invention relates to the field of liquid crystal display technologies, and in particular, to an array substrate and a display device comprising the array substrate.

Currently, array substrates generally include a display region and a bending region. In the bending region, a structure of the array substrate mainly includes a double-layered base layer, an organic layer, a metal trace, an organic photoresist, an ultraviolet (UV) glue, and the like arranged from bottom to top. First, defects are easily formed during a coating process of polyimide (PI) due to material and environment, and these defects will seriously affect the product yield. Therefore, at present, the thickness of a single-layered substrate layer is generally set at about 10 um to decrease parts of the defects, thereby reduces the effect of the defects on the product yield. Secondly, there is an inorganic film blocking layer in the middle of the double-layered base layer, which is better resistant to water and oxygen. Further, when the substrate layer is peeled off, upper thin film transistors will not be damaged easily by a high-energy laser. Therefore, due to the above reasons, the thickness of the current double-layered substrate layer is very thick, which is close to 20 um. In addition, there is an inorganic film layer in the middle of the double layer base layer. Further, because PI has a large Young's modulus, generally about 10 Gpa, it is difficult to adjust the stress on metal traces by adjusting the thickness of the organic photoresist or UV glue above the metal traces. Therefore, in the current array substrate, the neutral plane is usually located in the base layer, and the metal trace is above the neutral plane. When the array substrate is bent, the metal traces are subjected to tensile stress.

In addition, at present, the display panel is developed in a direction of a narrow frame, the width of the bending region and the bending radius are getting smaller and smaller, and the stress on the metal traces is also multiplied. Therefore, when the array substrate is bending, the metal traces are prone to breakage, and after the array substrate is bent, the picture shown by the display region is abnormal. Further, the adhesion between an upper substrate layer and the inorganic film layer in the double-layered substrate layer is limited, when the array substrate is bent, the base layers and the inorganic film layer are easily separated from each other, which seriously affect the product yield.

In order to solve the above problems, many substrate layer thinning processes have been proposed in the prior art, such as performing laser thinning on an underlying lower layer of a double-layered base layer. However, a laser thinning process is limited, and the flatness of the substrate layer cannot be well controlled. Further, it is easy to cause a certain degree of damage to the metal traces above the substrate layer during the process of laser thinning.

SUMMARY OF THE INVENTION

In order to solve the above technical problems, the present invention provides a display device having an array substrate. The array substrate forms at least one opening in the bending region, the at least one opening extends into a second base layer, and at least one metal trace covers a surface inside the at least one opening. Organic photoresist is filled above the at least one metal trace in the at least one opening, so that the neutral plane is located at the layer where the at least one metal trace is located, thereby reduce the stress on the at least one metal trace in the bending region.

In order to solve the above technical problems, the present invention provides an array substrate having a display region and a bending region surrounding the display region, wherein the array substrate comprises: a first substrate layer; a first buffer layer covering the first substrate layer; a second substrate layer covering the first buffer layer; at least one opening, wherein at least a part of the at least one opening is defined in the second substrate layer and located corresponding to the bending region; at least one metal trace extending over the display region and the bending region, wherein at least a part of the at least one metal trace covers a surface inside the at least one opening; an organic layer disposed in the at least one opening and encasing the at least one metal trace located inside the at least one opening.

In an embodiment of the invention, the first buffer layer has at least one first via hole, and the at least one first via hole is located corresponding to the at least one opening.

In an embodiment of the invention, in the bending region, a projection of the at least one metal trace on the first buffer layer completely falls into the at least one first via hole.

In an embodiment of the invention, the array substrate further comprises: a second buffer layer covering the second substrate layer; a first gate insulating layer covering the second buffer layer; a second gate insulating layer covering the first gate insulating layer; and a dielectric layer covering the second gate insulating layer; wherein the at least one metal trace is formed on the dielectric layer and in the at least one opening; and wherein in the bending region, the at least one opening extends from the dielectric layer and penetrates into the second substrate layer.

In an embodiment of the invention, the at least one opening has a stepped structure or an inverted tower-like structure, which comprises a plurality of holes, the plurality of holes are superposed from the dielectric layer to the second substrate layer, wherein a width of a lower hole is less than or equal to a width of a hole located above and adjacent the lower hole.

In an embodiment of the invention, widths of the holes are sequentially decreased from the dielectric layer to the second substrate layer.

In an embodiment of the invention, the at least one opening has a side, a bottom and an aperture, the side extends from the bottom toward the aperture, the width of the bottom is smaller than the width of the aperture, and an angle between the side and the bottom ranges from 45° to 70°.

In an embodiment of the invention, the at least one opening comprises a first hole extending from the dielectric layer to the first buffer layer; a second hole penetrates from the first buffer layer into the second substrate layer, and a bottom of the second hole is formed in the second substrate layer, a width of the second hole is smaller than a width of the first hole; a ratio of a depth of the first hole to a depth of the second hole body ranges from 0.1-5.

In an embodiment of the invention, the substrate further comprises: a planarization layer disposed on the at least one metal trace, the dielectric layer, and the organic layer; a pixel defining layer disposed on the planarization layer; wherein in the display region, the array substrate further comprises an active layer having a source and a drain, and the active layer being disposed on the second buffer layer, the first gate insulating layer covering the active layer; a first gate layer disposed on the first gate insulating layer, and the second gate insulating layer covers the first gate layer; a second gate layer disposed on the second gate insulating layer, and the dielectric layer covering the second gate layer; second via holes penetrating from the dielectric layer to the active layer, wherein one of the second via holes is located corresponding to the source and another one of the second via holes is located corresponding to the drain; wherein the at least one metal trace comprises a source trace and a drain trace, the source being correspondingly connected to the source trace, and the drain being correspondingly connected to the drain trace; a third via hole penetrating the planarization layer and the drain trace being exposed in the third via hole; and an anode trace disposed on the planarization layer and connected to the drain trace through the third via hole.

The present invention further provides a display device comprising the array substrate.

The present invention provides an array substrate and a display device having the array substrate. The array substrate forms at least one opening in the bending region, the at least one opening extends into a second base layer, and at least one metal trace covers a surface inside the at least one opening. Organic photoresist is filled above the at least one metal trace in the at least one opening, so that the neutral plane is located at the layer where the at least one metal trace is located, thereby reduce the stress on the at least one metal trace in the bending region. The metal trace closer to the neutral surface receives less tensile stress and is more resistant to bending. The array substrate of the present invention and the display device having the array substrate only adjust the thickness of the substrate layer and the inorganic film layer in the bending region, and do not change the film thickness of the substrate layer of the display region, thereby ensuring the product yield. At the same time, because the at least one metal trace in the bending region moves downward, the stress is reduced, which facilitates the bending of a smaller bending radius.

BRIEF DESCRIPTION OF THE SEVERAL VIEWS OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

REFERENCE NUMERALS

Figure 1:
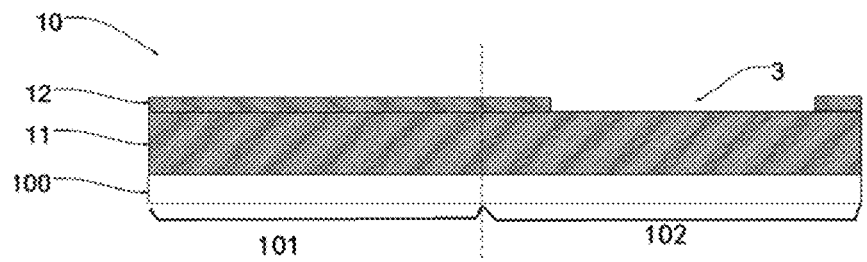
FIG. 1 is a structural diagram of an array substrate in an embodiment after the formation of a first buffer layer.

| 1 | display device; | | |
|---|---|---|---|
| 10 | array substrate; | 20 | color film substrate; |
| 101 | display region; | 102 | bending region; |
| 100 | glass substrate; | | |
| 11 | first substrate layer; | 12 | first buffer layer; |
| 13 | second substrate layer; | 14 | second buffer layer; |
| 15 | first gate insulating layer; | 16 | second gate insulating layer; |
| 17 | dielectric layer; | 18 | metal traces; |
| 19 | planarization layer; | 110 | anode traces; |
| 111 | pixel definition layer; | | |
| 1011 | active layer; | | |
| 10111 | source region; | 10112 | drain region; |
| 1012 | first gate layer; | 1013 | second gate layer; |
| 181 | source trace; | 182 | drain trace; |
| 183 | source; | 184 | drain; |
| 2 | openings; | 21 | holes; |
| 21a | first hole; | 21b | second hole; |
| 210 | bottom; | 212 | aperture; |
| 213 | side; | | |
| 3 | first via hole; | 4 | second via hole; |
| 5 | third via hole; | 6 | organic layer; |
| 7 | neutral planes. | | |

SPECIFIC EMBODIMENTS OF THE INVENTION

The embodiments of the present invention are described in detail below, and the examples of the embodiments are illustrated in the drawings, wherein the same or similar reference numerals indicate the same or similar elements or elements having the same or similar functions. The embodiments described below with reference to the drawings are intended to be illustrative of the invention and are not to be construed as limiting.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

As shown in FIG. 1 to FIG. 8, in an embodiment, an array substrate 10 of the present invention has a display region 101 and a bending region 102 surrounding the display region 101. Wherein, the array substrate 10 includes a first substrate layer 11, a first buffer layer 12, a second substrate layer 13, a second buffer layer 14, a first gate insulating layer 15, a second gate insulating layer 16, a dielectric layer 17, at least one metal trace 18, a planarization layer 19, and a pixel definition layer 111.

As shown in FIG. 1, the first buffer layer 12 is located on the first substrate layer 11.

Figure 2:
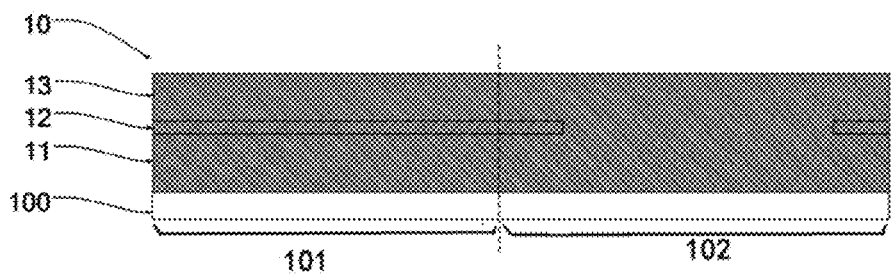
FIG. 2 is a structural diagram of an array substrate in an embodiment after the formation of a second substrate layer.

As shown in FIG. 2, the second substrate layer 13 is located on the first buffer layer 12.

Figure 3:
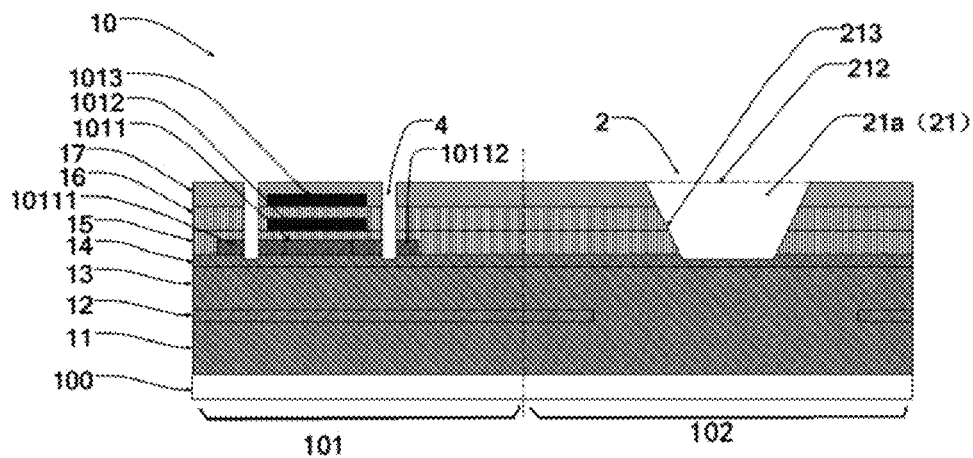
FIG. 3 is a structural diagram of an array substrate in an embodiment after the formation of a first hole.

As shown in FIG. 3, the second buffer layer 14 is located on the second substrate layer 13. In this embodiment, material of the first substrate layer 11 and the second substrate layer 13 are polyimide materials. Materials of the first buffer layer 12 and the second buffer layer 14 are inorganic materials which are insulated from water and oxygen.

Figure 8:
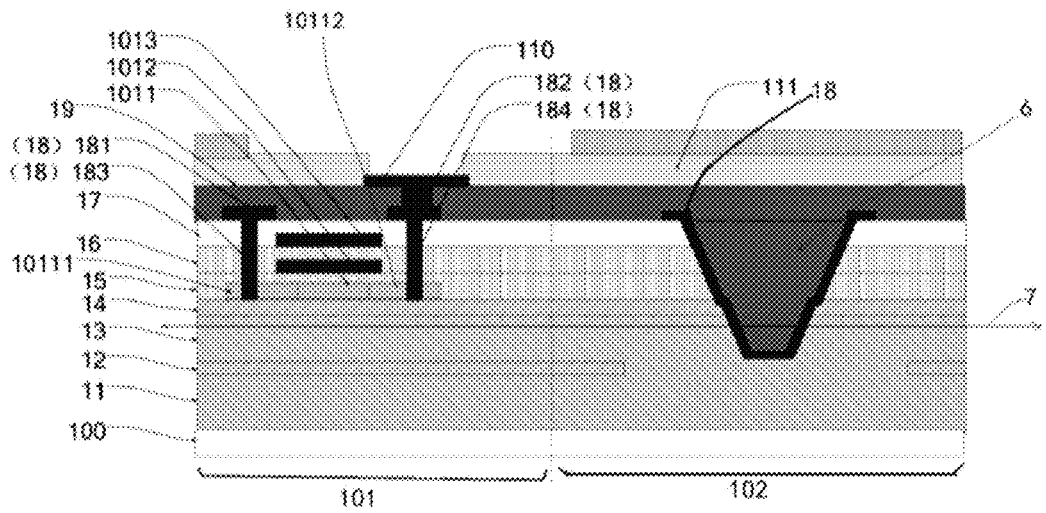
FIG. 8 is a structural diagram of an array substrate in an embodiment after the formation of a pixel defining layer, wherein, the neutral plane is located at a layer where the at least one metal trace is located.

Referring to FIG. 8, the first gate insulating layer 15 is located on the second gate insulating layer 16. The dielectric layer 17 is located on the second gate insulating layer 16. The metal traces 18 are located on the dielectric layer 17, and the metal traces 18 are distributed over the display region 101 and the bending region 102. The planarization layer 19 covers the metal traces 18.

Figure 4:
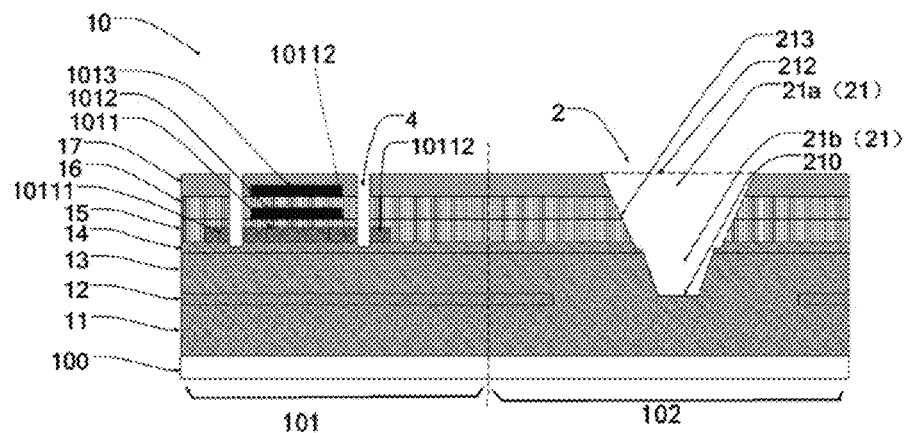
FIG. 4 is a structural diagram of an array substrate in an embodiment after the formation of a second hole.
Figure 6:
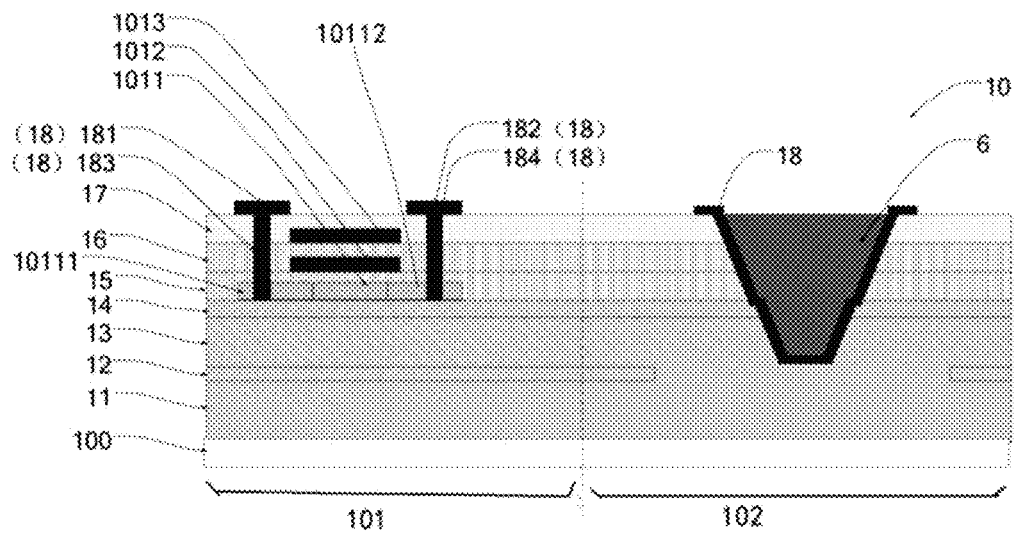
FIG. 6 is a structural diagram of an array substrate in an embodiment after the formation of an organic layer.

As shown in FIG. 3, FIG. 4, and FIG. 6, in the bending region 102, the array substrate 10 further includes at least one opening 2 and an organic layer 6 (see FIG. 6). The at least one opening 2 extends from the dielectric layer 17 into the second substrate layer 13. In the position of the at least one opening 2 of the bending region 102, the metal traces 18 cover a surface inside the at least one opening 2. The organic layer 6 disposed in the at least one opening 2 and encasing the metal traces 18 located inside the at least one opening 2. The height of the organic layer 6 does not exceed the depth of the opening 2. A neutral plane 7 passing through the metal traces 18 in the bending region 102 or the neutral plane 7 is as close as possible to the layer where the metal traces 18 are located.

In this embodiment, the at least one opening 2 has a stepped structure or an inverted tower-like structure, which comprises a plurality of holes 21, the plurality of holes 21 are superposed from the dielectric layer 17 to the second substrate layer 13. Widths of the holes 21 are sequentially decreased from the dielectric layer 17 to the second substrate layer 13. A width of a lower hole is less than or equal to a width of a hole located above and adjacent the lower hole. In this embodiment, each of the holes 21 has a ladder shape. The width of the holes actually refers to an average width of the hole. The at least one opening 2 has a side 213, a bottom 210, and an aperture 212, the side 213 extends from the bottom 210 toward the aperture 212, the width of the bottom 210 is smaller than the width of the aperture 212, and an angle between the side 213 and the bottom 210 ranges from 45° to 70°. The smaller the angle, the smoother the slope of the side 213. The smoother slope of the side 213 facilitates the formation of the metal traces 18 and increases the adhesion of the metal traces 18 to the surface inside the opening 2. Thereby, most of the metal traces 18 of the bending region 102 can be brought close to the neutral plane 7.

As shown in FIG. 4, in this embodiment, the double-layered hole is taken as an example to describe the stepped structure in detail. The at least one opening 2 comprises a first hole 21a extending from the dielectric layer 17 to the first buffer layer 14; a second hole 21b penetrates from the first buffer layer 14 into the second substrate layer 13, and a bottom 210 of the second hole 21b is formed in the second substrate layer 13, a width of the second hole 21b is smaller than a width of the first hole 21a; a ratio of a depth of the first hole 21a to a depth of the second hole 21b ranges from 0.1-5. In this embodiment, because the width of the bending region 102 is limited, the depth of the holes 21 in different layers is combined with the slope of the side 213. The slope of the side 213 corresponding to the holes 21 is adjusted by setting the depth of the holes 21 to improve the stress applied to the metal traces 18 covering the surface inside the holes 21.

As shown in FIG. 2 and FIG. 8, because material properties of the first buffer layer 12, the first substrate layer 11, and the second substrate layer 13 are different, when the bending region 102 is bent, a deformation degree of the first buffer layer 12, the first substrate layer 11, and the second substrate layer 13 is different. The material of the first buffer layer 12 is an inorganic material. When the bending region 102 is bent, the first buffer layer 12 is partially separated from the first substrate layer 11 and the second substrate layer 13, which make the neutral plane 7 (see FIG. 8) to shift toward one side of the first substrate layer 11 and affect the stress on the metal traces 18 in the bend region 102. Therefore, in the embodiment, a first via hole 3 (see FIG. 1) is disposed on the first buffer layer 12, and the first via hole 3 corresponds to the opening 2 (see FIG. 3). The first via holes 3 are filled with a polyimide material such that the first substrate layer 11 and the second substrate layer 13 at the bending region 102 are connected to each other.

In the bending region 102, in order to make the neutral plane 7 pass through the metal traces 18 as much as possible, so that most of the metal traces 18 are adjacent or partially fall on the neutral plane 7, in the present embodiment, in the bending region 102, the projection of the metal traces 18 on the first buffer layer 12 falls completely within the range of the first via holes 3.

As shown in FIG. 3 to FIG. 8, in the display region 101, the array substrate 10 further includes an active layer 1011, a first gate layer 1012, a second gate layer 1013, and at least one second via hole 4 (see FIG. 4), at least one third via hole 5 (see FIG. 7), an anode trace 110, and the like. The active layer 1011 has a source region 10111 and a drain region 10112. The active layer 1011 is disposed on the second buffer layer 14, and the first gate insulating layer 15 is disposed on the active layer 1011. The first gate layer 1012 is disposed on the first gate insulating layer 15. The second gate insulating layer 16 is disposed on the first gate layer 1012. The second gate layer 1013 is disposed on the second gate insulating layer 16. The dielectric layer 17 is disposed on the second gate layer 1013. At least one second via hole 4 penetrates from the dielectric layer 17 to the active layer 1011, wherein one of the at least one second via holes 4 corresponds to the source region 10111, and another one of the at least one second via holes 4 corresponds to the drain region 10112. The metal traces 18 include a source trace 181 and a drain trace 182. The source region 10111 is connected to the source trace 181, and the drain region 10112 is connected to the drain trace 182. The at least one third via hole 5 penetrates the planarization layer 19, and the drain trace 182 is exposed in the third via hole 5. The anode trace 110 (see FIG. 8) is disposed on the planarization layer 19 and connected to the drain trace 182 through the third via 5.

In order to explain the present invention more clearly, the following embodiment provides a method for manufacturing the array substrate 10, and the method specifically includes the following steps.

As shown in FIG. 1, a glass substrate 100 is provided.

Referring to FIG. 1, a layer of the polyimide material is coated on a surface of the glass substrate 100 to form the first substrate layer 11. An inorganic material having a function of insulating water and oxygen is deposited on the first substrate layer 11 to form the first buffer layer 12. The first buffer layer 12 is etched by a dry etching process to form first via holes 3. The first via holes 3 correspond to the bending region 102.

Referring to FIG. 2, a polyimide material is filled in the first via holes 3, and a polyimide material is coated on the first buffer layer 12 to form the second substrate layer 13.

Referring to FIG. 3, the second buffer layer 14 is formed on the second substrate layer 13 by deposition. The material of the second buffer layer 14 and the material of the first buffer layer 12 are both inorganic materials, and the materials can be the same or different. For the display region 101, the active layer 1011 is formed on the second buffer layer 14, and the active layer 1011 is crystallized and patterned to form the source region 10111 and the drain region 10112. The first gate insulating layer 15 is formed on the active layer 1011 and on the second buffer layer 14 by a deposition method. For the display region 101, a first metal layer is formed on the first gate insulating layer 15, and the first metal layer is patterned to form a gate and gate traces. The second gate insulating layer 16 is formed on the first metal layer and the first gate insulating layer 15 by deposition. For the display region 101, a second metal layer is formed on the second gate insulating layer 16, and the second metal layer is patterned to form a second plate and a bleed line. The dielectric layer 17 is formed on the second metal layer and the second gate insulating layer 16 by deposition.

Referring to FIG. 3, for a region of the active layer 1011 of the display region 101, the dielectric layer 17 is etched to form at least one second via hole 4. At the same time, the bending region 102 is etched to form the first hole 21a. The at least one second via hole 4 extends from the dielectric layer 17 to the active layer 1011. One of the second via holes 4 corresponds to the source region 10111, and another second via hole 4 corresponds to the drain region 10112. The first hole 21a penetrates from the dielectric layer 17 into the second buffer layer 14.

As shown in FIG. 4, the second buffer layer 14 and the second substrate layer 13 are etched in the first hole 21a of the bending region 102 to form the second hole 21b. The second hole 21b penetrates from the first buffer layer 14 into the second substrate layer 13, and the bottom 210 of the second hole 21b is formed in the second substrate layer 13, a width of the second hole 21b is smaller than a width of the first hole 21a; a ratio of a depth of the first hole 21a to a depth of the second hole 21b ranges from 0.1-5. In this embodiment, because the width of the bending region 102 is limited, the depth of the holes 21 in different layers is combined with the slope of the side 213. The slope of the side 213 corresponding to the hole 21 is adjusted by setting the depth of the hole 21 to improve the stress applied to the metal traces 18 covering the surface inside the hole 2.

Figure 5:
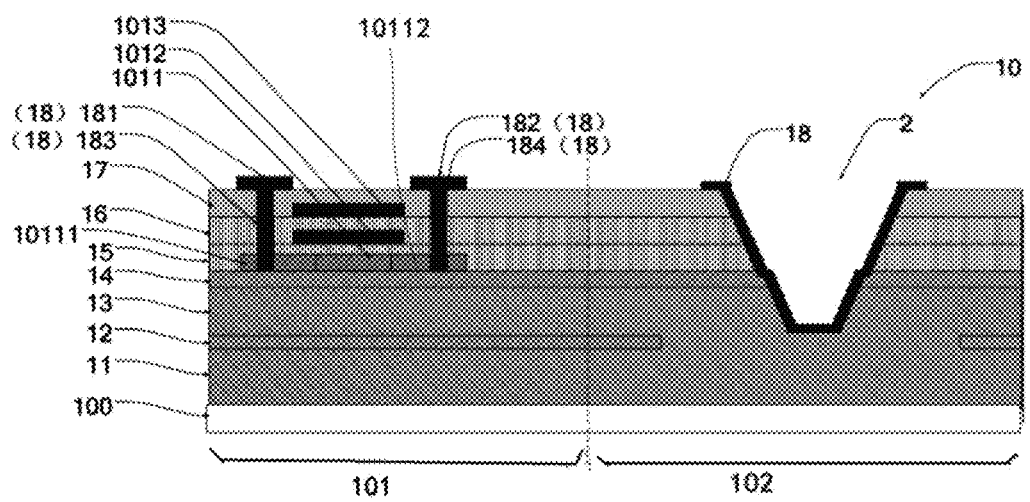
FIG. 5 is a structural diagram of an array substrate in an embodiment after the formation of at least one metal trace.

Referring to FIG. 5, the metal traces 18 extending from the display region 101 to the bending region 102 are formed on the dielectric layer 17 and in the at least one opening 2. The metal traces 18 are patterned to form a source 183 connected to the source region 10111, a drain 184 connected to the drain region 10112, and the metal trace 18. The metal traces 18 include the source trace 181 connected to the source 183 and the drain trace 182 connected to the drain 184. Referring to FIG. 6, an organic photoresist material is filled in the opening 2, and the organic layer 6 is formed. The organic layer 6 covers the metal traces 18, and the height of the organic layer 6 does not exceed the depth of the opening 2.

Referring to FIG. 6, the organic photoresist material is filled in the opening 2, and the organic layer 6 is formed. The organic layer 6 covers the metal traces 18, and the height of the organic layer 6 does not exceed the depth of the opening 2.

Figure 7:
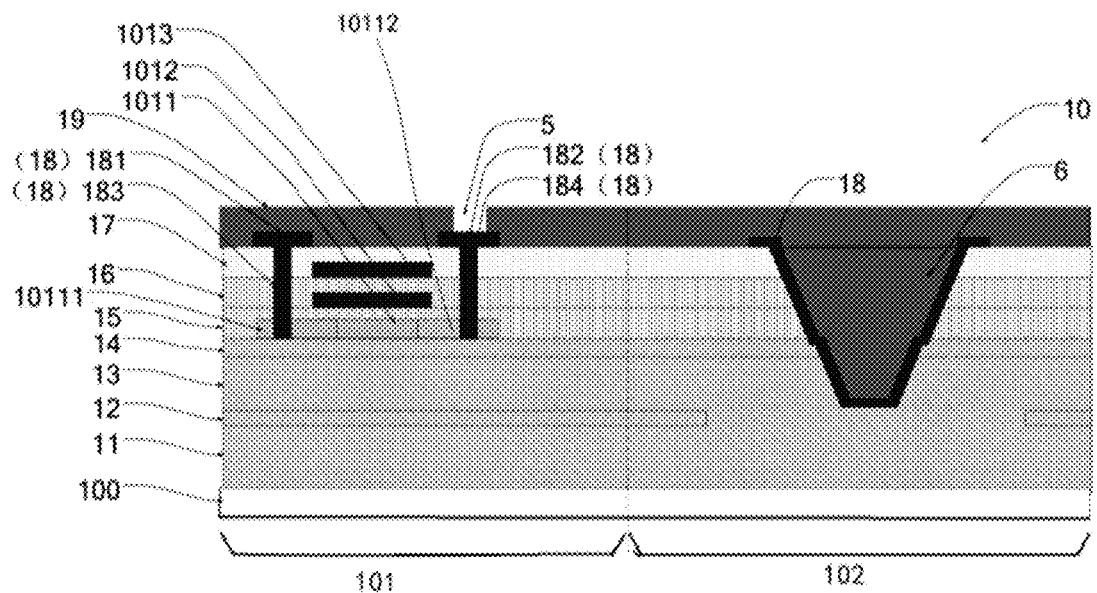
FIG. 7 is a structural diagram of an array substrate in an embodiment after the formation of a planarization layer.

Referring to FIG. 7, an organic film layer is coated and patterned on the dielectric layer 17, the metal traces 18 on the dielectric layer 17 and the organic layer 6 to form the planarization layer 19, and at least one third via hole 5 corresponding to the drain region 10112. The at least one third via hole 5 extends through the planarization layer 19, and the drain trace 182 is exposed to the at least one third via hole 5.

Referring to FIG. 8, an anode metal layer is formed on the planarization layer 19 by deposition, and patterned the anode metal layer to form the anode trace 110. The anode trace 110 is connected to the drain trace 182. An organic photoresist is applied over the anode traces 110 and a pixel defining layer 111 is formed.

Figure 9:
FIG. 9 is a structural diagram of a display device in the embodiment.

As shown in FIG. 9, the present invention also provides a display device 1 including the array substrate 10. The main design point of this embodiment lies in the array substrate 10, especially a layered distribution structure of the bending region 102 in the array substrate 10. That is, the at least one opening 2 is formed in the bending region 102, and the at least one opening 2 extends into the second substrate layer 13, and the metal traces 18 are formed on the surface inside the opening 2. The organic photoresist is filled on the metal traces 18 in the at least one opening 2 such that the neutral plane 7 passes through the metal traces 18 to reduce the stress on the metal traces 18 of the bending regions 102. Other structures of the display device 1 (such as an encapsulation layer, a polarizer, a color filter substrate 20, etc.) will not be described again.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An array substrate having a display region and a bending region surrounding the display region, wherein the array substrate comprises:
   a first substrate layer;
   a first buffer layer covering the first substrate layer;
   a second substrate layer covering the first buffer layer;
   at least one opening, wherein at least a part of the at least one opening is defined in the second substrate layer and located corresponding to the bending region;
   at least one metal trace extending over the display region and the bending region, wherein at least a part of the at least one metal trace covers a surface inside the at least one opening;
   an organic layer disposed in the at least one opening and encasing the at least one metal trace located inside the at least one opening;
   wherein the first buffer layer has at least one first via hole, and the at least one first via hole is located corresponding to the at least one opening.

2. The array substrate according to claim 1, wherein in the bending region, a projection of the at least one metal trace on the first buffer layer completely falls into the at least one first via hole.

3. The array substrate according to claim 1, wherein the array substrate further comprises:
   a second buffer layer covering the second substrate layer;

a first gate insulating layer covering the second buffer layer;

a second gate insulating layer covering the first gate insulating layer; and a dielectric layer covering the second gate insulating layer;

wherein the at least one metal trace is formed on the dielectric layer and in the at least one opening; and wherein in the bending region, the at least one opening extends from the dielectric layer and penetrates into the second substrate layer.

4. The array substrate according to claim 3, wherein the at least one opening has a stepped structure or an inverted tower-like structure, which comprises a plurality of holes, the plurality of holes are superposed from the dielectric layer to the second substrate layer, wherein a width of a lower hole is less than or equal to a width of a hole located above and adjacent the lower hole.

5. The array substrate according to claim 4, wherein widths of the holes are sequentially decreased from the dielectric layer to the second substrate layer.

6. The array substrate according to claim 4, wherein the at least one opening has a side, a bottom, and an aperture, the side extends from the bottom toward the aperture, the width of the bottom is smaller than the width of the aperture, and an angle between the side and the bottom ranges from 45° to 70°.

7. The array substrate according to claim 4, wherein the at least one opening comprises a first hole extending from the dielectric layer to the first buffer layer;

a second hole penetrates from the first buffer layer into the second substrate layer, and a bottom of the second hole is formed in the second substrate layer, a width of the second hole is smaller than a width of the first hole;

a ratio of a depth of the first hole to a depth of the second hole ranges from 0.1-5.

8. The array substrate according to claim 3, wherein the substrate further comprises:

a planarization layer disposed on the at least one metal trace, the dielectric layer, and the organic layer;

a pixel defining layer disposed on the planarization layer;

wherein in the display region, the array substrate further comprises an active layer having a source and a drain, and the active layer being disposed on the second buffer layer, the first gate insulating layer covering the active layer;

a first gate layer disposed on the first gate insulating layer, and the second gate insulating layer covers the first gate layer;

a second gate layer disposed on the second gate insulating layer, and the dielectric layer covering the second gate layer;

second via holes penetrating from the dielectric layer to the active layer, wherein one of the second via holes is located corresponding to the source and another one of the second via holes is located corresponding to the drain;

wherein the at least one metal trace comprises a source trace and a drain trace, the source being correspondingly connected to the source trace, and the drain being correspondingly connected to the drain trace;

a third via hole penetrating the planarization layer and the drain trace being exposed in the third via hole; and an anode trace disposed on the planarization layer and connected to the drain trace through the third via hole.

9. A display device comprising the array substrate of claim 1.

* * * * *